United States Patent
Chen

(10) Patent No.: US 10,002,783 B2
(45) Date of Patent: Jun. 19, 2018

(54) METHOD FOR MANUFACTURING MEMORY DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Liang Chen, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 13 days.

(21) Appl. No.: 15/352,823

(22) Filed: Nov. 16, 2016

(65) Prior Publication Data
US 2017/0194189 A1 Jul. 6, 2017

(30) Foreign Application Priority Data

Jan. 6, 2016 (CN) .......................... 2016 1 0006426

(51) Int. Cl.
*H01L 21/8238* (2006.01)
*H01L 21/762* (2006.01)
(Continued)

(52) U.S. Cl.
CPC ...... *H01L 21/762* (2013.01); *H01L 21/31111* (2013.01); *H01L 21/31155* (2013.01);
(Continued)

(58) Field of Classification Search
CPC ................................................ H01L 21/28273
See application file for complete search history.

(56) References Cited

U.S. PATENT DOCUMENTS 4,652,334 A * 3/1987 Jain .......................... C03C 15/00
  252/79.5
5,874,346 A * 2/1999 Fulford, Jr. ....... H01L 21/26586
  257/E21.345
(Continued)

OTHER PUBLICATIONS

EP Search Report corresponding to European Patent Application No. 16207185.6, May 23, 2017, 7 pages.

*Primary Examiner* — Kyoung Lee
*Assistant Examiner* — Christina Sylvia
(74) *Attorney, Agent, or Firm* — Innovation Counsel LLP

(57) ABSTRACT

A method for manufacturing a memory device may include the following steps: preparing a first semiconductor, a second semiconductor, a first conductor, and a second conductor, wherein the second semiconductor is spaced from the first semiconductor, wherein the first conductor directly contacts the first semiconductor, and wherein the second conductor is spaced from the first conducive member and directly contacts the second semiconductor; preparing a dielectric material member, which is positioned between the first semiconductor and the second semiconductor and directly contacts each of the first semiconductor, the second semiconductor, the first conductor, and the second conductor; performing ion implantation on the dielectric material member to form an implanted member and a dielectric member; and removing the implanted member.

20 Claims, 3 Drawing Sheets

(51) Int. Cl.
*H01L 21/311* (2006.01)
*H01L 21/3115* (2006.01)
*H01L 27/11521* (2017.01)
*H01L 29/06* (2006.01)
*H01L 21/8234* (2006.01)

(52) U.S. Cl.
CPC .. *H01L 21/76224* (2013.01); *H01L 21/76237* (2013.01); *H01L 21/823481* (2013.01); *H01L 21/823878* (2013.01); *H01L 27/11521* (2013.01); *H01L 29/0649* (2013.01)

(56) References Cited

U.S. PATENT DOCUMENTS

| | | | |
|---|---|---|---|
| 6,238,996 B1 * | 5/2001 | Liu | H01L 21/76232 |
| | | | 257/E21.549 |
| 7,541,240 B2 * | 6/2009 | Pham | H01L 21/3212 |
| | | | 438/257 |
| 2012/0032267 A1 | 2/2012 | Cheng et al. | |
| 2013/0137251 A1 | 5/2013 | Liou et al. | |
| 2015/0187634 A1 | 7/2015 | Chiang et al. | |

* cited by examiner

METHOD FOR MANUFACTURING MEMORY DEVICE

CROSS-REFERENCE TO RELATED APPLICATION

This application claims priority to and benefit of Chinese Patent Application No. 201610006426.7, filed on 6 Jan. 2016; the Chinese Patent Application is incorporated herein by reference in its entirety.

BACKGROUND OF THE INVENTION

The technical field is related to a method for manufacturing a memory device, such as a flash memory device, e.g., a NAND memory device.

A memory device may be used in write operations for storing data and may be used in read operations for retrieving data. A memory device may include floating gates and shallow trench isolation (STI) members positioned between the floating gates.

In manufacturing of the memory device, after the STI members have been formed, some unwanted insulating material portions (e.g., oxide portions) may remain on sidewalls of the floating gates and may not be substantially removed. The remaining insulating material portions may negatively affect performance of the floating gates. As a result, performance and/or quality of the memory device may be unsatisfactory.

SUMMARY

An embodiment may be related to a method for manufacturing a memory device, such as a flash memory device, e.g., a NAND memory device. The method may include preparing a semiconductor substrate, a first semiconductor, a second semiconductor, a first conductor, and a second conductor. The first semiconductor and the second semiconductor may be positioned on the semiconductor substrate. The second semiconductor may be spaced from the first semiconductor. The first conductor may directly contact the first semiconductor. The second conductor may be spaced from the first conducive member and may directly contact the second semiconductor. The first conductor and the second conductor may function as floating gate electrodes of the memory device. The method may include preparing a dielectric material member, which may be positioned between the first semiconductor and the second semiconductor and may directly contact each of the first semiconductor, the second semiconductor, the first conductor, and the second conductor. The method may include performing ion implantation on the dielectric material member to form an implanted member and a dielectric member. The method may include removing the implanted member.

The method may include performing an etching process (e.g., a wet etching process) to remove the implanted member. An etch rate of the implanted member corresponding to the etching process may be higher than an etch rate of a material of the dielectric material member corresponding to the etching process. The etch rate of the implanted member corresponding to the etching process is greater than or equal to eight times the etch rate of the material of the dielectric material member corresponding to the etching process. An etchant may be used in the etching process. The etchant may not include hydrofluoric acid.

The method may include providing at least one of arsenic ions, antimony ions, and bismuth ions to the dielectric material member for forming the implanted member.

The method may include providing arsenic ions to the dielectric material member for forming the implanted member.

Ions may be provided in a first direction and a second direction in the ion implantation. The first direction may be perpendicular to a bottom side of the semiconductor substrate. The second direction may be at an acute angle with respect to the bottom side of the semiconductor substrate.

The method may include partially removing the dielectric member to form an isolation member in a process of removing the implanted member.

The method may include configuring a dimension (e.g., thickness) of the implanted member based on a target dimension (e.g., target thickness) of the isolation member. The method may include removing the implanted member for exposing the isolation member.

The implanted member may directly contact each of the first conductor and the second conductor.

A minimum distance between the implanted member and the bottom side of the semiconductor substrate may be greater than a minimum distance between the first conductor and the bottom side of the semiconductor substrate.

The implanted member may be positioned between two portions of the dielectric member in a direction parallel to the bottom side of the semiconductor substrate.

The implanted member may include a first implanted portion, a second implanted portion, and a third implanted portion. The first implanted portion may be directly connected to the second implanted portion and may be connected through the second implanted portion to the third implanted portion. Each of the first implanted portion and the third implanted portion may extend above the second implanted portion with reference to the dielectric member and/or with reference to the bottom side of the semiconductor substrate. The first implanted portion may directly contact the first conductor. The third implanted portion may directly contact the second conductor.

A tangent of the first implanted portion may be at an obtuse angle with respect to a tangent of the second implanted portion and/or with respect to the bottom side of the semiconductor substrate.

The dielectric member may include a first dielectric portion and a second dielectric portion. The first dielectric portion may be positioned between the first implanted portion and the first conductor in the direction parallel to the bottom side of the semiconductor substrate and may directly contact each of the first implanted portion and the first conductor. The second dielectric portion may be positioned between the third implanted portion and the second conductor in the direction parallel to the bottom side of the semiconductor substrate and may directly contact each of the third implanted portion and the second conductor.

The first dielectric portion may be positioned between the first implanted portion and the first semiconductor in a direction perpendicular to the bottom side of the semiconductor substrate. The second dielectric portion may be positioned between the third implanted portion and the second semiconductor in the direction perpendicular to the bottom side of the semiconductor substrate.

According to embodiments, in manufacturing of a memory device, unwanted insulating material portions (e.g., oxide portions) that have attached to sidewalls of floating gates (e.g., side walls of the first conductor and/or the second conductor) of the memory device may be effectively removed. As a result, satisfactory performance of the floating gates may be attained. Advantageously, satisfactory reliability and/or performance of the electromechanical device may be attained.

The above summary is related to some of many embodiments of the invention disclosed herein and is not intended to limit the scope of the invention.

DETAILED DESCRIPTION

Figure 1:
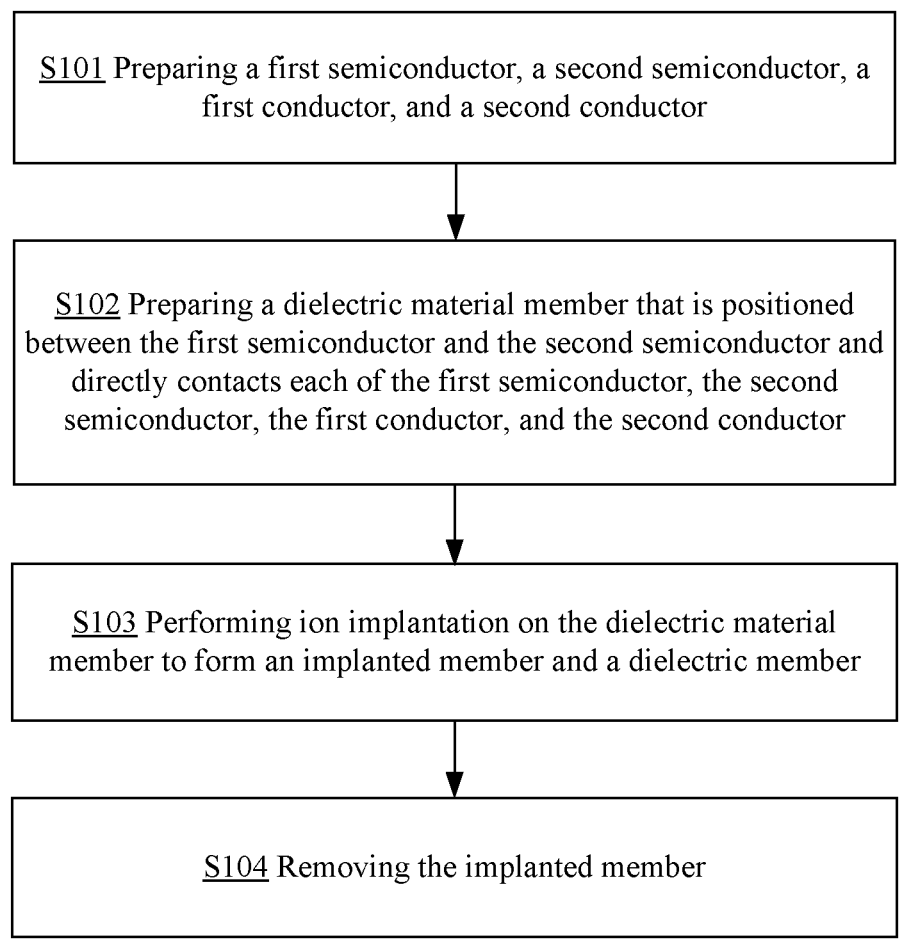
FIG. 1 shows a flowchart that illustrates steps in a method for manufacturing a memory device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "mechanically connect", "electrically connect", "directly connect", or "indirectly connect". The term "insulate" may mean "electrically insulate". The term "conductive" may mean "electrically conductive". The term "electrically connected" may mean "electrically connected without any intervening transistors". If a component (e.g., a transistor) is described as (electrically) connected between a first element and a second element, then a source/drain/input/output terminal of the component may be electrically connected to the first element through no intervening transistors, and a drain/source/output/input terminal of the component may be electrically connected to the second element through no intervening transistors.

The term "conductor" may mean "electrically conductor". The term "insulator" may mean "electrically insulating member". The term "dielectric" may mean "dielectric member". The term "interconnect" may mean "interconnecting member". The term "prepare", the term "provide", or the term "form" may mean "prepare, provide, and/or form". The term "side" may mean "flat side", "planar side", or "straight side".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a flowchart that illustrates steps in a method for manufacturing a memory device, such as a flash memory device, e.g., a NAND memory device, in accordance with one or more embodiments. FIG. 2A, FIG. 2B, FIG. 2C, and FIG. 2D show schematic diagrams (e.g., schematic cross-sectional views) that illustrate elements and/or structures formed in a method for manufacturing an memory device in accordance with one or more embodiments. The method may include steps S101, S102, S103, and S104.

Figure 2A:
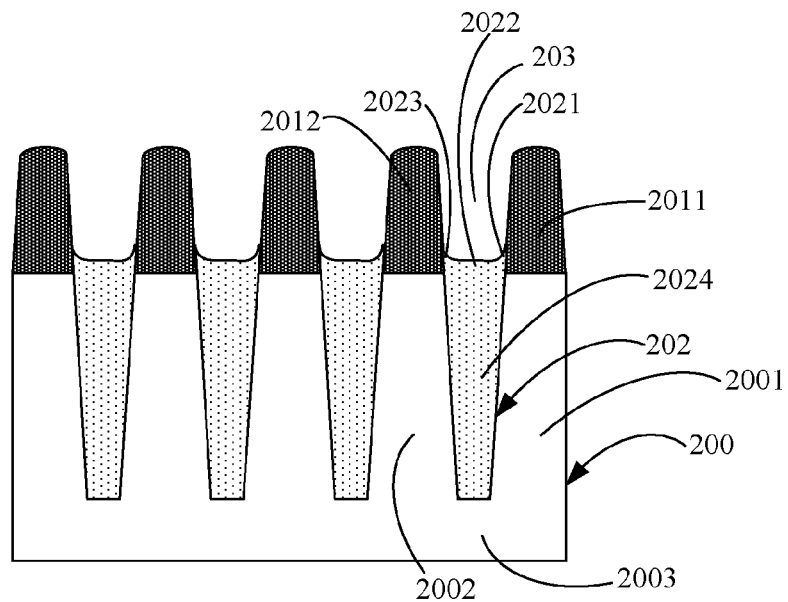
FIG. 2A, FIG. 2B, FIG. 2C, and FIG. 2D show schematic diagrams (e.g., schematic cross-sectional views) that illustrate elements and/or structures formed in a method for manufacturing an memory device in accordance with one or more embodiments.

Referring to FIG. 1 and FIG. 2A, the step S101 may include preparing a substrate structure 200, a conductor 2011, and a conductor 2012. The substrate structure 200 may include a semiconductor substrate 2003, a semiconductor 2001, and a semiconductor 2002. The semiconductor 2001 and the semiconductor 2002 may be positioned on the semiconductor substrate 2003. The semiconductor 2002 may be spaced from the semiconductor 2001. The conductor 2011 may directly contact the semiconductor 2001. The conductor 2012 may be spaced from the first conducive member and may directly contact the semiconductor 2002.

The first conductor 2011 and the second conductor 2012 may be formed of a conductive material, such as a polycrystalline silicon material, e.g., a doped polycrystalline silicon material.

The substrate structure 200 and/or the semiconductor substrate 2003 may be/include at least one of a silicon substrate, a silicon-on-insulator (SOI) substrate, a strained-silicon-on-insulator (SSOI) substrate, a strained-silicon-germanium-on-insulator (S—SiGeOI), a silicon-germanium-on-insulator (SiGeOI) substrate, and a germanium-on-insulator (GeOI) substrate.

The step S101 may include the following steps: preparing a substrate material layer (e.g., a semiconductor material layer); preparing a conductive material layer (e.g., a polycrystalline silicon material layer) on the substrate material layer; preparing a mask on the conductive material layer; partially removing (e.g., using an etching process) the conductive material layer and the substrate material layer to form the conductor 2011, the conductor 2012, the semiconductor 2001, the semiconductor 2002, and the semiconductor substrate 2003 and to form a trench 203 between the semiconductors 2001 and 2002 and between the conductors 2011 and 2012.

Referring to FIG. 1 and FIG. 2A, the step S102 may include preparing a dielectric material member 202 inside the trench 203. The dielectric material member 202 may be positioned between the semiconductor 2001 and the semiconductor 2002 and may directly contact each of the semiconductor 2001, the semiconductor 2002, the conductor 2011, and the conductor 2012. The dielectric member 202 may partially expose a sidewall of each of the conductors 2011 and 2012. The maximum height of the dielectric member 202 with reference to the bottom side of the substrate 2003 may be less than the maximum height of the conductor 2011 with reference to the bottom side of the substrate 2003. The maximum height of the dielectric member 202 with reference to the bottom side of the substrate 2003 may be greater than the maximum height of the semiconductor 2001 with reference to the bottom side of the substrate 2003.

The dielectric material member 202 may include a dielectric portion 2021, a dielectric portion 2022, and a dielectric portion 2023. The dielectric portions 2021, 2022, and 2023 may be exposed. The dielectric portion 2021 may directly contact the conductor 2011 and may be connected through the dielectric portion 2022 to the dielectric portion 2023. The dielectric portion 2023 may directly contact the conductor 2012. The dielectric portions 2021 and 2023 may extend above the dielectric portion 2022 (given that the substrate 2003 is positioned below the dielectric portion 2022).

The dielectric material member 202 may be formed of a dielectric material with a dielectric constant less than or equal to 3.9. The dielectric material member 202 may be formed of at least one of silicon oxide, silicon oxynitride, etc.

The step S102 may include the following steps: providing a dielectric material layer that covers the mask and extends into the trench 203; planarizing (e.g., using a chemical-mechanical planarizing process) the dielectric material layer to remove a portion of the dielectric material layer that is positioned outside the trench 203, such that a dielectric material body may remain inside the trench 203 and may substantially or completely cover a sidewall of each of the conductors 2011 and 2012; removing (e.g., using a wet etching process) the mask; and partially removing (e.g., using a blank dry etching process) the dielectric material body to form the dielectric material member 202, which may partially expose sidewalls of the conductors 2011 and 2012.

Referring to FIG. 1, FIG. 2A, FIG. 2B, and FIG. 2C, the step S103 performing ion implantation on the dielectric material member 202 to form an implanted member 204 and a dielectric member 212. The step S103 may include providing at least one of arsenic ions, antimony ions, and bismuth ions to the dielectric material member 202 for forming the implanted member 204. A dose of the ion implantation (e.g., arsenic ion implantation) may be in a range of $1 \times 10^{10}$ ions/cm$^2$ to $1 \times 10^{11}$ ions/cm$^2$. The dielectric member 212 may be a portion of the dielectric material member 202 that is not substantially affected by the ion implantation.

The implanted member 204 may directly contact each of the conductor 2011 and the conductor 2012. The implanted member 204 may include an implanted portion 2041, an implanted portion 2042, and an implanted portion 2043. The step S103 may include providing arsenic ions to the dielectric portions 2021, 2022, and 2023 of the dielectric material member 202 for forming the implanted portions 2041, 2042, and 2043 of the implanted member 204. The applied in the ion implantation may be sufficiently low, such that ions are implanted into the dielectric portions 2021, 2022, and 2023 without being implanted into a dielectric portion 2024 of the dielectric material member 202. The dielectric portion 2024 may be positioned closer to the semiconductor substrate 2003 than the dielectric portions 2021, 2022, and 2023, may not be exposed, and may not directly contact either of the conductors 2011 and 2012.

The ions implanted into the dielectric portions 2021, 2022, and 2023 may weaken and/or destroy silicon-oxygen bonds in the dielectric portions 2021, 2022, and 2023 for forming the implanted portions 2041, 2042, and 2043.

Figure 2B:
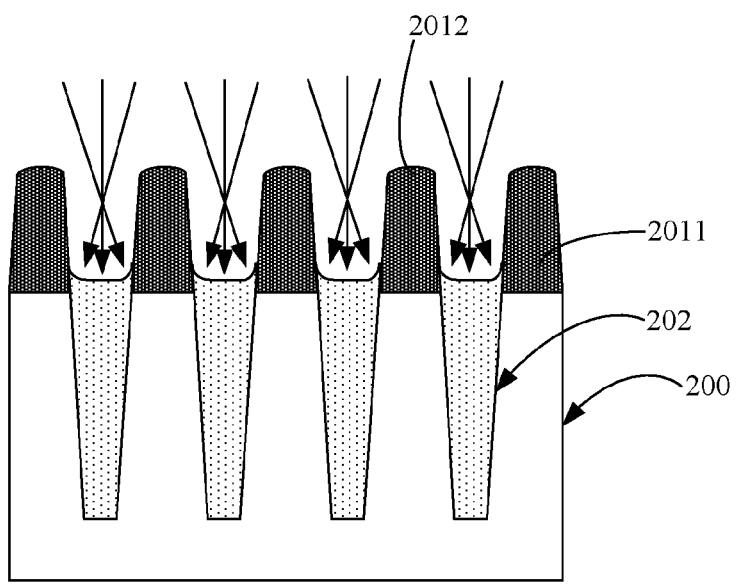

Referring to FIG. 2B, for effectively implanting ions into all the dielectric portions 2021, 2022, and 2023, ions may be provided in a first direction, a second direction, and a third direction during the ion implantation. The first direction may be perpendicular to the bottom side of the semiconductor substrate 2003. Each of the second direction and the third direction may be at an acute angle with respect to the bottom side of the semiconductor substrate 2003.

Figure 2C:
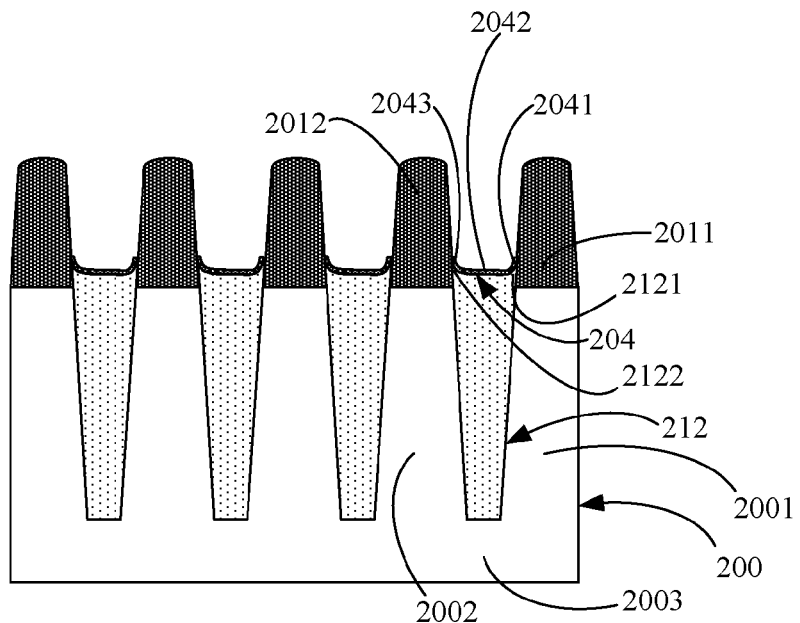

Referring to FIG. 2C, the minimum distance between the implanted member 204 and the bottom side of the semiconductor substrate 2003 may be greater than the minimum distance between the conductor 2011 and the bottom side of the semiconductor substrate 2003. The maximum height of the implanted member 204 with reference to the bottom side of the semiconductor substrate 2003 may be less than the maximum height of the conductor 2011 with reference to the bottom side of the semiconductor substrate 2003

The dielectric member 212 may include a dielectric portion 2121 and a dielectric portion 2122. The implanted member 204 may be positioned between the dielectric portion 2121 and the dielectric portion 2122 in a direction parallel to the bottom side of the semiconductor substrate 2003.

The implanted portion 2041 may be directly connected to the implanted portion 2042 and may be connected through the implanted portion 2042 to the implanted portion 2043. Each of the implanted portion 2041 and the implanted portion 2043 may extend above the implanted portion 2042 with the dielectric member 212 and/or the semiconductor substrate 2003 being positioned below the implanted portion 2042. The implanted portion 2041 may directly contact the conductor 2011. The implanted portion 2043 may directly contact the conductor 2012. A tangent of the implanted portion 2041 may be at an obtuse angle or a right angle with respect to a tangent of the implanted portion 2042 and/or with respect to the bottom side of the semiconductor substrate 2003. A tangent of the implanted portion 2043 may be at oblique or perpendicular with respect to the tangent of the implanted portion 2042 and/or with respect to the bottom side of the semiconductor substrate 2003.

The dielectric portion 2121 may be positioned between the implanted portion 2041 and the conductor 2011 in the direction parallel to the bottom side of the semiconductor substrate 2003 and may directly contact each of the implanted portion 2041 and the conductor 2011. The dielectric portion 2122 may be positioned between the implanted portion 2043 and the conductor 2012 in the direction parallel to the bottom side of the semiconductor substrate 2003 and may directly contact each of the implanted portion 2042 and the conductor 2012.

The dielectric portion 2121 may be positioned between the implanted portion 2041 and the conductor 2011 in a direction perpendicular to the bottom side of the semiconductor substrate 2003. The dielectric portion 2122 may be positioned between the implanted portion 2043 and the conductor 2012 in the direction perpendicular to the bottom side of the semiconductor substrate 2003.

The dielectric portion 2121 may be positioned between the implanted portion 2041 and the semiconductor 2001 in the direction perpendicular to the bottom side of the semiconductor substrate 2003. The dielectric portion 2122 may be positioned between the implanted portion 2043 and the semiconductor 2002 in the direction perpendicular to the bottom side of the semiconductor substrate 2003.

Figure 2D:
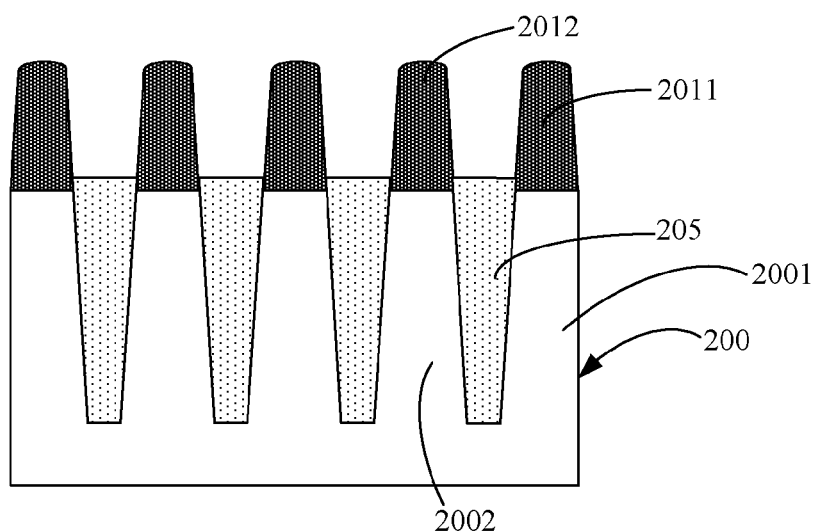

Referring to FIG. 1, FIG. 2C, and FIG. 2D, the step S104 may include removing the implanted member 204. In the step S104, the dielectric member 212 may be partially removed to form an isolation member 205. The step S104 may include performing an etching process (e.g., a wet etching process) to remove the implanted member 204. An etchant used in the etching process may be different from dilute hydrofluoric acid (DHF) and may not contain hydrofluoric acid (HF). The acidity of the etchant may be weaker than the acidity of the DHF.

The etching process may also remove portions of the dielectric member 212, e.g., the dielectric portions 2121 and 2122, to form the isolation member 205, which may sufficiently insulate and/or isolate conductors 2011 and 2012 from each other. The method (e.g., the step S103) may include configuring one or more dimensions of the implanted member 204 (e.g., one or more thicknesses of one or more of the implanted portions 2041, 2042, and 2043) and/or configuring the etching process based on one or more target dimensions (e.g., a target thickness and/or a target height) of the isolation member 205 to be subsequently formed. The step S104 may include removing the implanted member 204 for exposing the isolation member 205.

The method may include providing insulating layers (e.g., oxide-nitride-oxide layers) on the conductors 2011 and 2012. The method may include providing additional conductors on the insulating layers for implementing control gate electrodes of the memory device.

According to embodiments, an etch rate of the implanted member 204 corresponding to the etching process may be substantially higher than an etch rate of the material of the dielectric material member 202 (i.e., an etch rate of the material of the dielectric member 212) corresponding to the etching process. In embodiments, the etch rate of the implanted member 204 corresponding to the etching process may be higher than or equal to eight times the etch rate of the material of the dielectric material member 202 corresponding to the etching process. Therefore, by completely or partially turning the dielectric portions 2021 and 2023 of the dielectric material member 202 into the implanted portions 2041 and 2043 of the implanted member 204, the unwanted dielectric portions 2021 and 2023 (and the unwanted dielectric portions 2121 and 2122), which have partially covered sidewalls of the conductors 2011 and 2012, may be effectively removed.

In embodiments, the method may include configuring one or more dimensions of the implanted member 204 and/or configuring the etching process for implementing one or more dimension of the isolation member 205. Therefore, one or more suitable dimensions of the isolation member 205 may be attained.

As a result, satisfactory performance of the conductor 2011 and 2012, which function as floating gate electrodes, and/or the isolation member 205 may be attained. Advantageously, satisfactory performance and/or quality of the memory device may be attained.

While some embodiments have been described as examples, there are alterations, permutations, and equivalents. It should be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is intended that the following appended claims be interpreted as including all alterations, permutations, and equivalents.

What is claimed is:

1. A method for manufacturing a memory device, the method comprising:
preparing a first semiconductor, a second semiconductor, a first conductor, and a second conductor, wherein the second semiconductor is spaced from the first semiconductor, wherein the first conductor overlaps the first semiconductor, and wherein the second conductor is spaced from the first conducive member and overlaps the second semiconductor;
preparing a dielectric material member, which is positioned between the first semiconductor and the second semiconductor and directly contacts each of the first semiconductor, the second semiconductor, the first conductor, and the second conductor;
performing ion implantation on the dielectric material member to form an implanted member and a dielectric member; and
removing the implanted member,
wherein the first semiconductor and the second semiconductor are positioned on a semiconductor substrate, wherein ions are provided in a first direction and a second direction in the ion implantation, wherein the first direction is perpendicular to a bottom side of the semiconductor substrate, and wherein the second direction is at an acute angle with respect to the bottom side of the semiconductor substrate.

2. The method of claim 1 comprising: performing an etching process to remove the implanted member, wherein an etch rate of the implanted member corresponding to the etching process is higher than an etch rate of a material of the dielectric material member corresponding to the etching process.

3. The method of claim 2, wherein the etch rate of the implanted member corresponding to the etching process is greater than or equal to eight times the etch rate of the material of the dielectric material member corresponding to the etching process.

4. The method of claim 1 comprising: using an etchant to remove the implanted member, wherein the etchant does not comprise hydrofluoric acid.

5. The method of claim 1 comprising: providing at least one of arsenic ions, antimony ions, and bismuth ions to the dielectric material member for forming the implanted member.

6. The method of claim 1 comprising: providing arsenic ions to the dielectric material member for forming the implanted member.

7. The method of claim 1, wherein the implanted member comprises a first implanted portion, a second implanted portion, and a third implanted portion, wherein the second implanted portion is directly connected to each of the first implanted portion and the third implanted portion and is positioned between the first implanted portion and the third implanted portion, and wherein each of the first implanted portion and the third implanted portion is concave.

8. The method of claim 1 comprising: partially removing the dielectric member to form an isolation member in a process of removing the implanted member.

9. The method of claim 1 comprising:
configuring a dimension of the implanted member based on a target dimension of an isolation member; and
removing the implanted member for exposing the isolation member.

10. The method of claim 1, wherein the implanted member directly contacts each of the first conductor and the second conductor.

11. The method of claim 1, wherein a minimum distance between the implanted member and the bottom side of the semiconductor substrate is greater than a minimum distance between the first conductor and the bottom side of the semiconductor substrate.

12. A method for manufacturing a memory device, the method comprising:
preparing a first semiconductor, a second semiconductor, a first conductor, and a second conductor, wherein the second semiconductor is spaced from the first semiconductor, wherein the first conductor overlaps the first semiconductor, and wherein the second conductor is spaced from the first conducive member and overlaps the second semiconductor;
preparing a dielectric material member, which is positioned between the first semiconductor and the second semiconductor and directly contacts each of the first semiconductor, the second semiconductor, the first conductor, and the second conductor;
performing ion implantation on the dielectric material member to form an implanted member and a dielectric member; and
removing the implanted member, wherein the first semiconductor and the second semiconductor are positioned on a semiconductor substrate, and wherein the implanted member is positioned between two portions of the dielectric member in a direction parallel to a bottom side of the semiconductor substrate and directly contacts both the two portions of the dielectric member.

13. A method for manufacturing a memory device, the method comprising:
preparing a first semiconductor, a second semiconductor, a first conductor, and a second conductor, wherein the second semiconductor is spaced from the first semiconductor, wherein the first conductor overlaps the first semiconductor, and wherein the second conductor is spaced from the first conducive member and overlaps the second semiconductor;
preparing a dielectric material member, which is positioned between the first semiconductor and the second semiconductor and directly contacts each of the first semiconductor, the second semiconductor, the first conductor, and the second conductor;
performing ion implantation on the dielectric material member to form an implanted member and a dielectric member; and
removing the implanted member, wherein the implanted member comprises a first implanted portion, wherein the first semiconductor and the second semiconductor are positioned on a semiconductor substrate, wherein the dielectric member comprises a first dielectric portion, wherein the first dielectric portion is positioned between the first implanted portion and the first conductor in a direction parallel to a bottom side of the semiconductor substrate and directly contacts each of the first implanted portion and the first conductor.

14. The method of claim 13, wherein the first implanted portion has a first concave cross-section.

15. The method of claim 14, wherein the implanted member comprises a second implanted portion opposite the first implanted portion and having a second concave cross-section.

16. The method of claim 13, wherein the first dielectric portion is positioned between the first implanted portion and the first semiconductor in a direction perpendicular to the bottom side of the semiconductor substrate.

17. The method of claim 13, wherein the implanted member comprises a second implanted portion and a third implanted portion, wherein the first implanted portion is connected through the second implanted portion to the third implanted portion, and wherein each of the first implanted portion and the third implanted portion extends above the second implanted portion.

18. The method of claim 17, wherein the first implanted portion directly contacts the first conductor, and wherein the third implanted portion directly contacts the second conductor.

19. The method of claim 18, wherein the dielectric member comprises a second dielectric portion, and wherein the second dielectric portion is positioned between the third implanted portion and the second conductor in the direction parallel to the bottom side of the semiconductor substrate and directly contacts each of the third implanted portion and the second conductor.

20. The method of claim 19, wherein the first dielectric portion is positioned between the first implanted portion and the first semiconductor in a direction perpendicular to the bottom side of the semiconductor substrate, and wherein the second dielectric portion is positioned between the third implanted portion and the second semiconductor in the direction perpendicular to the bottom side of the semiconductor substrate.

* * * * *